(12) United States Patent
Yan

(10) Patent No.: US 10,812,065 B2
(45) Date of Patent: Oct. 20, 2020

(54) POWER SUPPLY CONTROL APPARATUS

(71) Applicant: GENERAL ELECTRIC TECHNOLOGY GMBH, Baden (CH)

(72) Inventor: Jun Yan, Stafford (GB)

(73) Assignee: GENERAL ELECTRIC TECHNOLOGY GMBH, Baden (CH)

( * ) Notice: Subject to any disclaimer, the term of this patent is extended or adjusted under 35 U.S.C. 154(b) by 0 days.

(21) Appl. No.: 16/270,973

(22) Filed: Feb. 8, 2019

(65) Prior Publication Data

US 2019/0253049 A1    Aug. 15, 2019

(30) Foreign Application Priority Data

Feb. 9, 2018   (EP) .................................... 18156059

(51) Int. Cl.
*H03K 17/284*   (2006.01)
*H03K 17/22*    (2006.01)
*H03K 17/28*    (2006.01)
*H02M 1/36*     (2007.01)
*G06F 1/26*     (2006.01)

(52) U.S. Cl.
CPC ........... *H03K 17/284* (2013.01); *H03K 17/22* (2013.01); *H03K 17/28* (2013.01); *G06F 1/26* (2013.01); *H02M 1/36* (2013.01)

(58) Field of Classification Search
None
See application file for complete search history.

(56) References Cited

U.S. PATENT DOCUMENTS 5,763,960 A * 6/1998 Ceccherelli .......... H03K 17/223
                                              307/130
7,721,213 B2 * 5/2010 Chidambaram .. H02J 13/00001
                                              715/736

(Continued)

FOREIGN PATENT DOCUMENTS

JP          61048218 A     3/1986
JP          63045914 A     2/1988

OTHER PUBLICATIONS

European Search Report and Written Opinion dated Jun. 21, 2018 which was issued in connection with EP 18156059.0 which was filed on Feb. 9, 2018.

*Primary Examiner* — Cassandra F Cox
(74) *Attorney, Agent, or Firm* — Eversheds Sutherland (US) LLP

(57) ABSTRACT

There is provided a power supply control apparatus for connection to electrical inputs of an electronic device wherein each electrical input is operatively connected to a power source having a sequencer circuit and a control element, the sequencer circuit including sequencer stage(s). The sequencer circuit selectively receives an indication signal, the sequencer circuit selectively receives a positive indication signal indicative of a voltage supplied to a first of the electrical inputs reaching or passing a predefined voltage threshold, and the sequencer circuit selectively provides a control signal to the control element, the control element triggerable by a positive control signal. Each sequencer stage includes circuit elements, the first selectively receives an input signal and selectively provides an intermediate signal to the second, the second selectively provides an output signal.

10 Claims, 2 Drawing Sheets

(56) References Cited

U.S. PATENT DOCUMENTS

| | | | |
|---|---|---|---|
| 2004/0217749 A1* | 11/2004 | Orr | H02M 3/33569 |
| | | | 323/299 |
| 2007/0257727 A1 | 11/2007 | Goh | |
| 2013/0307501 A1 | 11/2013 | Kadanka et al. | |
| 2017/0084246 A1* | 3/2017 | Joshi | H02J 9/005 |

* cited by examiner

POWER SUPPLY CONTROL APPARATUS

BACKGROUND OF THE DISCLOSURE

This invention relates to a power supply control apparatus.

It is known to use a power sequencer to control the supply of power to an electronic device having multiple electrical inputs.

BRIEF SUMMARY

According to an aspect of the invention, there is provided a power supply control apparatus for connection to a plurality of electrical inputs of an electronic device wherein each electrical input is operatively connected to a power source, wherein the power supply control apparatus comprises a power supply sequencer circuit and a power supply control element, the power supply sequencer circuit including at least one power supply sequencer stage, a. wherein the power supply sequencer circuit is configured to selectively receive an indication signal, the power supply sequencer circuit configured to selectively receive a positive indication signal indicative of a voltage supplied to a first of the electrical inputs reaching or passing a predefined voltage threshold, and the power supply sequencer circuit is configured to selectively provide a control signal to the power supply control element, the power supply control element configured to be triggerable by a positive control signal so that the power supply control element forms an electrical connection for connecting a second of the electrical inputs to the power source so as to permit supply of power from the power source to the second electrical input, and b. wherein the or each power supply sequencer stage includes first and second circuit elements, the first circuit element is configured to selectively receive an input signal, the first circuit element is configured to selectively provide an intermediate signal to the second circuit element, the second circuit element is configured to selectively provide an output signal, the first circuit element is configured to be triggerable by a positive input signal so that the first circuit element provides a negative intermediate signal to the second circuit element, and the second circuit element is configured to be triggerable by the negative intermediate signal so that the second circuit element provides a positive output signal.

The power supply control apparatus of the invention may be used to control the supply of power to a wide range of electronic devices, including integrated circuits such as field programmable gate array (FPGA) devices, system-on-a-chip devices, and processors.

It will be understood that, for the purposes of this specification, a positive signal is representative of a high signal or a logical one, and a negative signal is representative of a low signal or a logical zero.

The configuration of the power supply sequencer circuit in the power supply control apparatus of the invention permits the provision of a stable and customizable delay between the supply of power to different electrical inputs (e.g. voltage rails) of the electronic device, thus improving the reliability and efficiency of the power sequencing procedure. Such a delay is independent of the voltage ramp rate of the power supplied by the power source. The delay may, preferably, be configured to introduce a "soft-start" to the supply of power to a given electrical input to avoid the problem of inrush current.

The inclusion of the or each power supply sequencer stage in the power supply sequencer circuit enables the generation of a negative intermediate signal in response to the positive indication signal and, in turn, enables the generation of a positive control signal in response to the negative intermediate signal. This signal generation sequence permits a simpler and more cost-effective design of the power supply sequencer circuit by allowing the use of components capable of generating a positive signal in response to a negative signal and vice versa. In addition, this signal generation sequence obviates the need for costlier power good pins, and thereby permits the use of the invention with low-cost voltage regulators without power good pins, such as dc-dc converters and low-dropout regulators.

Furthermore, the above signal generation sequence results in a safer power sequencing procedure, as the design of the power supply sequencer circuit to provide a positive control signal to trigger the power supply control element prevents accidental triggering of the power supply control element when the power supply control apparatus is not working properly.

It will be appreciated that the power supply control apparatus may include a further power supply sequencer circuit and a further power supply control element. The further power supply sequencer circuit is similar in structure and operation to the power sequencer circuit, and the further power supply control element is similar in structure and power supply control element. The further power supply sequencer circuit may be configured to selectively receive a positive indication signal indicative of a voltage supplied to the second electrical input reaching or passing a predefined voltage threshold, which enables the further power supply sequencer circuit to provide a positive control signal to trigger the further power supply control element so that the further power supply control element forms an electrical connection for connecting a third of the electrical inputs to the power source so as to permit supply of power from the power source to the third electrical input. Additional, power supply sequencer circuits and power supply control elements may be incorporated in the power supply control apparatus, depending on the number of electrical inputs of the associated electronic device.

In embodiments of the invention, the power supply sequencer circuit may include first and second power supply sequencer stages, the second circuit element of the first power supply sequencer stage configured to provide the output signal to the first circuit element of the second power supply sequencer stage. In further embodiments of the invention, the power supply sequencer circuit may further include an additional power supply sequencer stage, the second circuit element of the second power supply sequencer stage configured to provide the output signal to the first circuit element of the additional power supply sequencer stage. It will be appreciated that the power supply sequencer circuit may include any number of power supply sequencer stages.

The configuration of the invention permits a cascade arrangement of a plurality of power supply sequencer stages to allow for further customization of the delay between the supply of power to different electrical inputs of the electronic device. The amount of delay may depend on the number of power supply sequencer stages.

In still further embodiments of the invention, the or each power supply sequencer stage may include an electronic filter. In such embodiments, the electronic filter may be or may include a resistor-capacitor filter.

The inclusion of the electronic filter in the or each power supply sequencer stage provides a further option for customizing the delay between the supply of power to different electrical inputs of the electronic device.

The configuration of each circuit element may vary so long as the first circuit element is configured to selectively receive an input signal, the first circuit element is configured to selectively provide an intermediate signal to the second circuit element, the second circuit element is configured to selectively provide an output signal, the first circuit element is configured to be triggerable by a positive input signal so that the first circuit element provides a negative intermediate signal to the second circuit element, and the second circuit element is configured to be triggerable by the negative intermediate signal so that the second circuit element provides a positive output signal.

Each circuit element may be or may include a logic or comparator element.

Each circuit element may be or may include a switching element. In such embodiments, each circuit element may be or may include a transistor. Optionally the transistor of each circuit element may be an insulated gate bipolar transistor (IGBT).

The configuration of the power supply control element may vary so long as it is capable of forming an electrical connection for connecting a second of the electrical inputs to the power source so as to permit supply of power from the power source to the second electrical input.

The power supply control element may be or may include a switching element. In such embodiments, the switching element of the power supply control element may be or may include a transistor. Optionally, the transistor of the power supply control element may be an n-channel MOSFET.

It will be appreciated that the use of the terms "first" and "second", and the like, in this patent specification is merely intended to help distinguish between similar features (e.g., the first and second circuit elements, the first and second power supply sequencer stages), and is not intended to indicate the relative importance of one feature over another feature, unless otherwise specified.

BRIEF DESCRIPTION OF THE DRAWINGS

Preferred embodiments of the invention will now be described, by way of non-limiting examples, with reference to the accompanying drawings in which.

DETAILED DESCRIPTION

The figures are not necessarily to scale, and certain features and certain views of the figures may be shown exaggerated in scale or in schematic form in the interests of clarity and conciseness.

Figure 1:
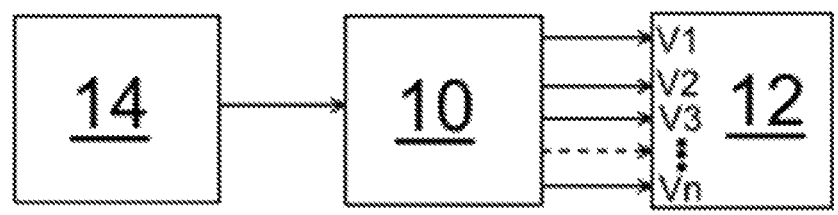
FIGS. 1 and 2 show schematically a power supply control apparatus according to a first embodiment of the invention.
Figure 2:
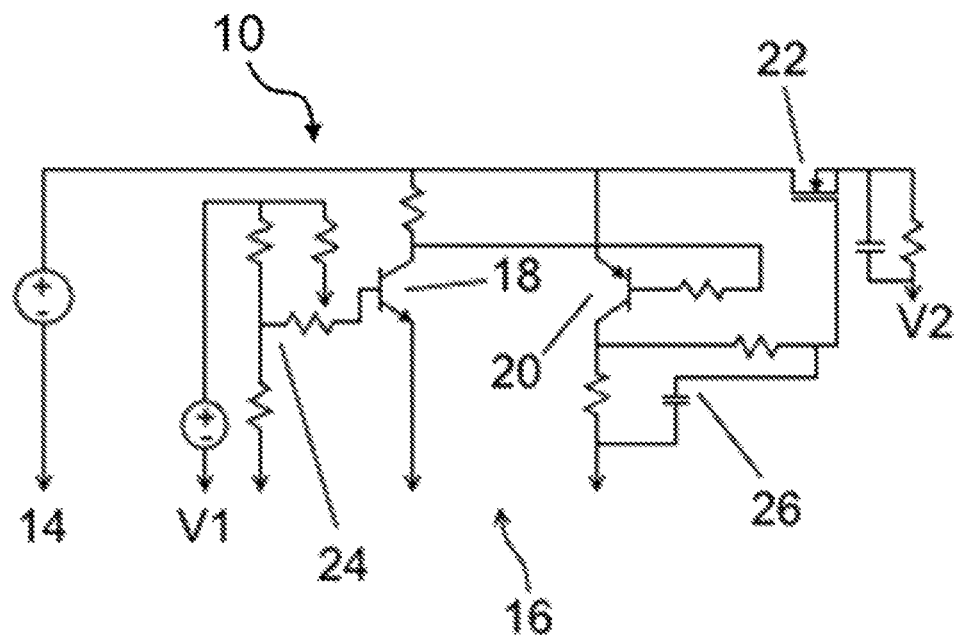

A power supply control apparatus according to a first embodiment of the invention, is shown in FIG. 1 and is designated generally by the reference numeral 10. This embodiment is described with reference to its use to control the supply of power to an FPGA device 12, but it will be appreciated that this embodiment can also be used to control the supply of power to other types of electronic devices.

In use, the power supply control apparatus 10 interconnects a power source 14 and a plurality of electrical inputs of the FPGA device 12 so that the power supply control apparatus 10 is operable to permit the supply of power from the power source 14 to each electrical input. In the embodiment shown, each electrical input of the FPGA device is in the form of a voltage rail V1, V2, V3, Vn.

The power supply control apparatus 10 comprises a power supply sequencer circuit and a power supply control element. The power supply sequencer circuit includes a power supply sequencer stage 16, which includes first and second circuit elements in the form of first and second IGBTs 18, 20. The power supply control element is in the form of an n-channel MOSFET 22 configured to function as a load switch.

A first V1 of the voltage rails of the FPGA device 12 is operatively connected to the gate of the first IGBT 18 via a voltage divider 24. The values of the resistors of the voltage divider 24 are configured so that a positive (or high) indication signal is provided as an input signal to the gate of the first IGBT 18 to turn it on when a voltage of the first voltage rail V1 reaches or passes a predefined voltage threshold, and so that a negative (or low) indication signal is provided as an input signal to the gate of the first IGBT 18 to turn it off for all other values of the voltage of the first voltage rail V1.

The power source 14 is connected, in use, to a drain of the n-channel MOSFET 22. A second V2 of the voltage rails of the FPGA device 12 is operatively connected to a source of the n-channel MOSFET 22. This configuration of the n-channel MOSFET 22 enables the connection of the power source 14 to the second voltage rail V2 when the n-channel MOSFET 22 is turned on, and the disconnection of the power source 14 from the second voltage rail V2 when the n-channel MOSFET 22 is turned off.

The collector of the first IGBT 18 is connected in shunt with the first voltage rail V1, and is also operatively connected to the gate of the second IGBT 20. This configuration of the collector of the first IGBT 18 means that:

when the first IGBT 18 is turned off, the voltage at the collector of the first IGBT 18 is sufficiently large to provide a positive intermediate signal to the gate of the second IGBT 20 to turn it on; and when the first IGBT 18 is turned on, the voltage at the collector of the first IGBT 18 is sufficiently low to provide a negative intermediate signal to the gate of the second IGBT 18 to turn it off.

The emitter of the second IGBT 20 is connected in shunt with the first voltage rail V1. The collector of the second IGBT 20 is operatively connected to the gate of the n-channel MOSFET 22 via a resistor-capacitor filter 26. This configuration of the second IGBT 20 means that:

when the second IGBT 20 is turned off, the voltage at the collector of the second IGBT 20 is sufficiently large to provide a positive control signal to the gate of the n-channel MOSFET 22 to turn it on; and when the second IGBT 20 is turned on, the voltage at the collector of the second IGBT 20 is sufficiently large to provide a negative control signal to the gate of the n-channel MOSFET 22 to turn it off.

It is envisaged that, in other embodiments of the invention, each IGBT 18, 20 may be replaced by another type of switching element, a logic element, or a comparator element. It is also envisaged that, in still other embodiments of the invention, the n-channel MOSFET 22 may be replaced by another type of switching element. It will be appreciated that the resistor-capacitor filter 26 is an optional feature of the embodiment, and may be omitted or replaced by another type of electronic filter.

A power sequencing procedure of the power supply control apparatus 10 of FIG. 1 is described as follows with reference to FIGS. 3 and 4.

Initially, before the first voltage rail V1 is connected to the power source 14, the first voltage rail V1 is at a voltage level which has not reached or passed the predefined voltage threshold. At this stage the negative indication signal is provided as the input signal to the gate of the first IGBT 18 to turn it off, which results in the provision of a positive intermediate signal to the gate of the second IGBT 20 and therefore the turn-on of the second IGBT 20. As a result, the negative control signal is provided to the gate of the n-channel MOSFET 22 to trigger its turn-off, thus disconnecting the power source 14 from the second voltage rail V2.

Figure 3:
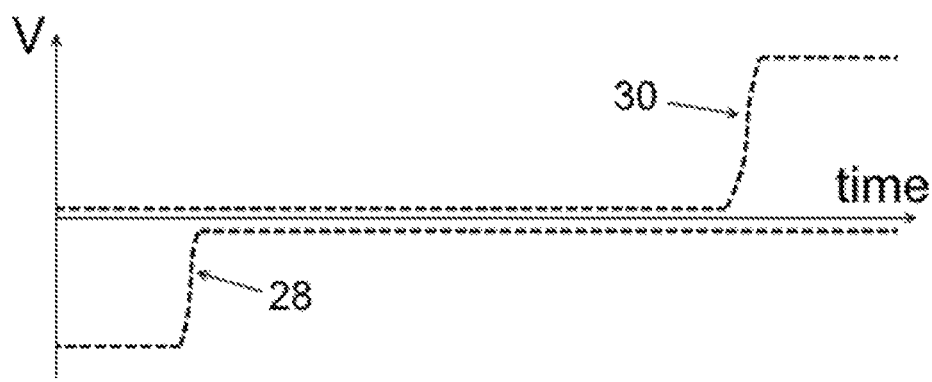
FIGS. 3 and 4 illustrate operations of the power supply control apparatus of FIG. 1 to control the supply of power to an FPGA device.
Figure 4:
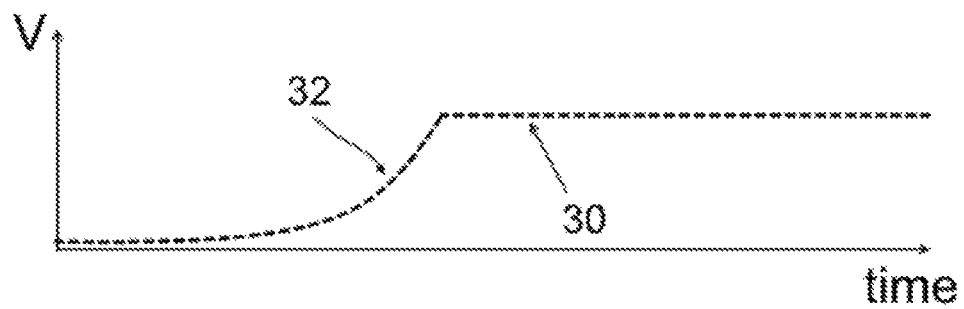

When power is supplied from the power source 14 to the first voltage rail V1, the voltage 28 of the first voltage rail V1 climbs until it reaches the predefined voltage threshold, as shown in FIG. 3. This results in the generation of the positive indication signal, which turns on the first IGBT 18 and thereby causes the voltage of the collector of the first IGBT 18 to drop to a value sufficiently low to provide a negative intermediate signal to the gate of the second IGBT 20. This, in turn, triggers the turn-off of the second IGBT 20 to cause the voltage of the collector of the second IGBT 20 to rise to a level which provides a positive control signal to the gate of the n-channel MOSFET 22. This triggers the turn-on of the n-channel MOSFET 22 so that the power source 14 is now connected to the second voltage rail V2, thus permitting the supply of power to the second voltage rail V2. This results in an increase in voltage 30 of the second voltage rail V2, as shown in FIG. 3.

The above power sequencing procedure is described with reference to supply of power to the first and second voltage rails V1, V2, but it will be appreciated that the above power sequencing procedure is applicable to any two of the voltage rails V1, V2, V3, Vn of the FPGA device 12.

The arrangement of the first and second IGBTs 18, 20 in the power sequencer stage 16 provides a delay, typically in the range of milliseconds, between the voltage 28 of the first voltage rail V1 reaching or passing the predefined voltage threshold and the turn-on of the n-channel MOSFET 22, thus providing a delay between the supply of power between the first and second voltage rails V1, V2. Furthermore, the values of the resistor and capacitor in the resistor-capacitor filter 26 may be configured to further modify the amount of delay, typically in the range of milliseconds, between the supply of power between the first and second voltage rails V1, V2. Such a delay not only is independent of the voltage ramp rate of the power supplied by the power source 14, but also can be configured to introduce a "soft-start" 32 to the supply of power to the second voltage rail V2 to avoid the problem of inrush current, as shown in FIG. 4.

The reliability and efficiency of the power sequencing procedure is, therefore, enhanced by the configuration of the power supply sequencer circuit in the power supply control apparatus 10 of FIG. 1 which permits the provision of a stable and customizable delay between the supply of power to the voltage rails V1, V2, V3, Vn of the FPGA device 12.

The signal generation sequence of the power supply sequencer stage 16 permits a simpler and more cost-effective design of the power supply sequencer circuit by allowing the use of the IGBTs 18, 20, and removes the requirements for costlier power good pins. Also, the removal of the need for power good pins permits the use of the invention with low-cost voltage regulators without power good pins, such as dc-dc converters and low-dropout regulators.

In addition, the above-described signal generation sequence of the power supply sequencer stage 16 results in a safer power sequencing procedure. If the power supply sequencer circuit is instead designed to provide a negative control signal to trigger the n-channel MOSFET 22, the power supply sequencer circuit will continue to provide the negative control signal even when the power supply control apparatus 10 is not working properly, thus resulting in accidental triggering of the n-channel MOSFET 22. On the other hand, designing the power supply sequencer circuit to provide a positive control signal to trigger the n-channel MOSFET 22 means that the power supply sequencer circuit would not accidentally trigger the n-channel MOSFET 22 due to the output of the power supply sequencer circuit reverting to a negative signal when the power supply control apparatus 10 is not working properly.

Moreover, using the n-channel MOSFET 22 as the load switch is more reliable, cheaper, and consume less power than using a p-channel MOSFET 22 as the load switch.

Figure 5:
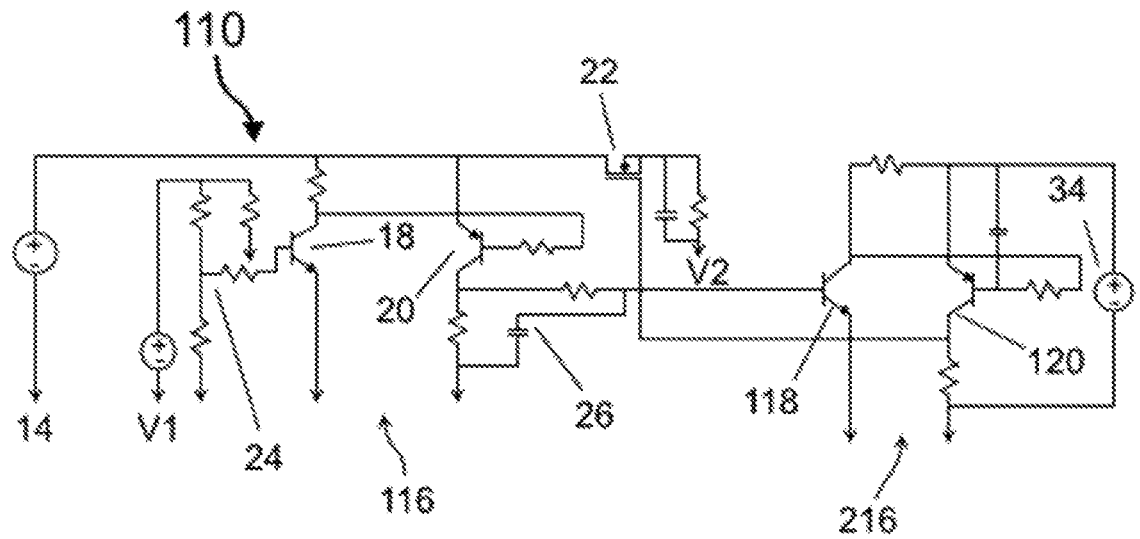
FIG. 5 shows schematically a power supply control apparatus according to a second embodiment of the invention.

A power supply control apparatus according to a second embodiment of the invention, is shown in FIG. 5 and is designated generally by the reference numeral 110. The power supply control apparatus 110 of FIG. 5 is similar in structure and operation to the power supply control apparatus 10 of FIG. 1 and like features share the same reference numerals The power supply control apparatus 110 of FIG. 5 differs from the power supply control apparatus 10 of FIG. 1, in that, in the power supply control apparatus 110 of FIG. 5, the power supply sequencer circuit includes first and second power supply sequencer stages 116, 216, instead of the single power supply sequencer stage 16 shown in FIG. 1.

The first power supply sequencer stage 116 in FIG. 5 is similar in structure to the power supply sequencer stage in FIG. 1, and the second power supply sequencer stage 216 is arranged between the first power supply sequencer stage 116 and the gate of the n-channel MOSFET 22. The second power supply sequencer stage 216 includes first and second IGBTs 118, 120, with a collector of the first IGBT 118 connected to the gate of the second IGBT 120 and with the collector of the second IGBT 120 connected to the gate of the n-channel MOSFET 22. The collector of the second IGBT 20 of the first power supply sequencer stage 116 is connected to a gate of the first IGBT 118 of the second power supply sequencer stage 216. A DC voltage source 34 is connected to the collector of the first IGBT 118 of the second power supply sequencer stage 216, and is connected across the second IGBT 120 of the second power supply sequencer stage 216.

The configuration of the second power supply sequencer stage 216 means that: when the second IGBT 20 of the first power supply sequencer stage 116 is turned off, the voltage at the collector of the second IGBT 20 of the first power supply sequencer stage 116 is sufficiently large to provide a positive input signal to the gate of the first IGBT 118 of the second power supply sequencer stage 216 to turn it on;

when the second IGBT 20 of the first power supply sequencer stage 116 is turned on, the voltage at the collector of the second IGBT 20 of the first power supply sequencer stage 116 is sufficiently low to provide a negative input signal to the gate of the first IGBT 118 of the second power supply sequencer stage 216 to turn it off;

when the first IGBT 118 of the second power supply sequencer stage 216 is turned off, the voltage at the collector of the first IGBT 118 of the second power supply sequencer stage 216 is sufficiently large to provide a positive intermediate signal to the gate of the second IGBT 120 of the second power supply sequencer stage 216 to turn it on;

when the first IGBT 118 of the second power supply sequencer stage 216 is turned on, the voltage at the collector of the first IGBT 118 of the second power supply sequencer stage 216 is sufficiently low to provide a negative intermediate signal to the gate of the second IGBT 120 to turn it off;

when the second IGBT 120 of the second power supply sequencer stage 216 is turned off, the voltage at the collector of the second IGBT 120 of the second power supply sequencer stage 216 is sufficiently large to provide a positive control signal to the gate of the n-channel MOSFET 22 to turn it on; and when the second IGBT 120 of the second power supply sequencer stage 216 is turned on, the voltage at the collector of the second IGBT 120 of the second power supply sequencer stage 216 is sufficiently large to provide a negative control signal to the gate of the n-channel MOSFET 22 to turn it off.

A power sequencing procedure for the power supply control apparatus 110 of FIG. 5 is described as follows.

Initially, before the first voltage rail V1 is connected to the power source 14, the first voltage rail V1 is at a voltage level which has not reached or passed the predefined voltage threshold. At this stage the negative indication signal is provided as the input signal to the gate of the first IGBT 18 of the first power supply sequencer stage 116 to turn it off, which results in the provision of a positive intermediate signal to the gate of the second IGBT 20 of the first power supply sequencer stage 116, and therefore, the turn-on of the second IGBT 20 of the first power supply sequencer stage 116. In turn, this triggers the turn-off of the first IGBT 18 and the turn-on of the second IGBT 20 of the second power supply sequencer stage 216. As a result, the negative control signal is provided to the gate of the n-channel MOSFET 22 to trigger its turn-off, thus disconnecting the power source 14 from the second voltage rail V2.

When power is supplied from the power source 14 to the first voltage rail V1, the voltage of the first voltage rail V1 climbs until it reaches the predefined voltage threshold. This results in the generation of the positive indication signal, which turns on the first IGBT 18 of the first power supply sequencer stage 116 and thereby causes the voltage of the collector of the first IGBT 18 of the first power supply sequencer stage 116 to drop to a value sufficiently low to provide a negative intermediate signal to the gate of the second IGBT 20 of the first power supply sequencer stage 116. This, in turn, triggers the turn-off of the second IGBT 20 of the first power supply sequencer stage 116 to cause the voltage of the collector of the second IGBT 20 of the first power supply sequencer stage 116 to rise to a level which provides a positive input signal to turn on the first IGBT 118 of the second power supply sequencer stage 216. This subsequently leads to the provision of a negative intermediate signal to the second IGBT 120 of the second power supply sequencer stage 216 to turn it off, thus providing a positive control signal to the gate of the n-channel MOSFET 22. This triggers the turn-on of the n-channel MOSFET 22 so that the power source 14 is now connected to the second voltage rail V2, thus permitting the supply of power to the second voltage rail V2. This results in an increase in voltage of the second voltage rail V2.

The addition of the second power supply sequencer stage 216 adds a further delay to the overall delay between the supply of power to different voltage rails V1, V2 of the FPGA device 12. The cascade arrangement of the first and second power supply sequencer stages 116, 216, therefore, allows for further customization of the delay between the supply of power to different voltage rails V1, V2 of the FPGA device 12. More particularly, the amount of delay can be increased by further increasing the number of power supply sequencer stages in the cascade arrangement.

What we claim is:

1. A power supply control apparatus for connection to a plurality of electrical inputs of an electronic device wherein each electrical input is operatively connected to a power source, wherein the power supply control apparatus comprises a power supply sequencer circuit and a power supply control element, the power supply sequencer circuit including at least one power supply sequencer stage, wherein the power supply sequencer circuit is configured to selectively receive an indication signal, the power supply sequencer circuit configured to selectively receive a positive indication signal indicative of a voltage supplied to a first of the electrical inputs reaching or passing a predefined voltage threshold, and the power supply sequencer circuit is configured to selectively provide a control signal to the power supply control element, the power supply control element configured to be triggerable by a positive control signal so that the power supply control element forms an electrical connection for connecting a second of the electrical inputs to the power source so as to permit supply of power from the power source to the second electrical input, and wherein each power supply sequencer stage includes first and second circuit elements, the first circuit element is configured to selectively receive an input signal, the first circuit element is configured to selectively provide an intermediate signal to the second circuit element, the second circuit element is configured to selectively provide an output signal, the first circuit element is configured to be triggerable by a positive input signal so that the first circuit element provides a negative intermediate signal to the second circuit element, and the second circuit element is configured to be triggerable by the negative intermediate signal so that the second circuit element provides a positive output signal.

2. The power supply control apparatus according to claim 1, wherein the power supply sequencer circuit includes first and second power supply sequencer stages, the second circuit element of the first power supply sequencer stage configured to provide the output signal to the first circuit element of the second power supply sequencer stage.

3. The power supply control apparatus according to claim 2, wherein the power supply sequencer circuit further includes an additional power supply sequencer stage, the second circuit element of the second power supply sequencer stage configured to provide the output signal to the first circuit element of the additional power supply sequencer stage.

4. The power supply control apparatus according to claim 1, wherein each power supply sequencer stage includes an electronic filter.

5. The power supply control apparatus according to claim 4, wherein the electronic filter is or includes a resistor-capacitor filter.

6. The power supply control apparatus according to claim 1, wherein each circuit element is or includes a logic or comparator element.

7. The power supply control apparatus according to claim 1, wherein each circuit element is or includes a switching element.

8. The power supply control apparatus according to claim 7, wherein each circuit element is or includes a transistor.

9. The power supply control apparatus according to claim 1, wherein the power supply control element is or includes a switching element.

10. The power supply control apparatus according to claim 9, wherein the switching element of the power supply control element is or includes a transistor.

* * * * *